(12) United States Patent
Kozaki

(10) Patent No.: US 6,900,684 B2
(45) Date of Patent: May 31, 2005

(54) PULSE PROCESSING CIRCUIT AND FREQUENCY MULTIPLIER CIRCUIT

(75) Inventor: Minoru Kozaki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/271,317

(22) Filed: Oct. 15, 2002

(65) Prior Publication Data

US 2003/0080783 A1 May 1, 2003

(30) Foreign Application Priority Data

Oct. 18, 2001 (JP) ........................................ 2001-321120

(51) Int. Cl.[7] ............................................ H03H 11/26
(52) U.S. Cl. ........................ 327/264; 327/278; 327/288
(58) Field of Search ................................ 327/116, 119, 327/122, 262, 263, 264, 276, 277, 278, 281, 285, 288

(56) References Cited

U.S. PATENT DOCUMENTS

| | | | | |
|---|---|---|---|---|
| 5,955,902 A | * | 9/1999 | Takada et al. | 327/116 |
| 5,959,486 A | * | 9/1999 | Choi | 327/228 |
| 6,005,420 A | * | 12/1999 | Yoshizawa et al. | 327/116 |
| 6,121,817 A | * | 9/2000 | Yang et al. | 327/355 |
| 6,122,492 A | * | 9/2000 | Sears | 455/127.1 |
| 6,340,910 B1 | | 1/2002 | Saeki | 327/296 |
| 6,381,192 B1 | * | 4/2002 | Ahn et al. | 365/230.08 |
| 6,525,569 B1 | * | 2/2003 | Leon | 326/83 |
| 6,525,584 B2 | * | 2/2003 | Seo et al. | 327/276 |

FOREIGN PATENT DOCUMENTS

| | | |
|---|---|---|
| CN | 1279550 | 1/2001 |
| JP | 2001-209454 | 8/2001 |

OTHER PUBLICATIONS

Communication from Chinese Patent Office re: counterpart application with English Translation.

* cited by examiner

Primary Examiner—Timothy P. Callahan
Assistant Examiner—Cassandra Cox
(74) Attorney, Agent, or Firm—Harness, Dickey & Pierce, P.L.C.

(57) ABSTRACT

PMOS transistors P1–Pn and PMOS transistors P1'–Pn' are respectively connected in series between a supply voltage terminal VD and output terminals OUTB, while NMOS transistors N1–Nn and NMOS transistors N1'–Nn' are respectively connected in series between the output terminals OUTB and a ground terminal G. Input terminals S1–Sn are respectively connected to the gates of the PMOS transistors P1'–Pn' and NMOS transistors N1–Nn, and they are respectively connected to the gates of the PMOS transistors P1–Pn and NMOS transistors N1'–Nn' through corresponding inverters IV1–IVn.

6 Claims, 6 Drawing Sheets

PRIOR ART

PULSE PROCESSING CIRCUIT AND FREQUENCY MULTIPLIER CIRCUIT

BACKGROUND OF THE INVENTION

1. Technical Field to which the Invention Belongs

The present invention relates to a pulse processing circuit which outputs the logical sum of non-overlapping pulses and a frequency multiplier circuit.

2. Prior Art

In a certain frequency multiplier circuit in the prior art, non-overlapping pulses are generated by utilizing the shifts of multiphase clocks, and the logical sum of the non-overlapping pulses is taken, thereby a clock frequency which is N times higher is obtained.

Here, in the prior-art frequency multiplier circuit, a multi-input OR circuit is employed in order to take the logical sum of the non-overlapping pulses.

FIG. 10 is a diagram showing the first example arrangement of a multi-input OR circuit in the prior art. Incidentally, in the example of FIG. 10, a 3-input OR circuit is shown for the sake of brevity.

Referring to FIG. 10, the multi-input OR circuit is constructed of three blocks, and each of the blocks is provided with three PMOS transistors and one NMOS transistor which are connected in series.

More specifically, PMOS transistors P11, P12, P13 and an NMOS transistor N11 are connected in series between a supply voltage terminal VD and a ground terminal G, PMOS transistors P21, P22, P23 and an NMOS transistor N12 are connected in series between a supply voltage terminal VD and a ground terminal G, and PMOS transistors P31, P32, P33 and an NMOS transistor N13 are connected in series between a supply voltage terminal VD and a ground terminal G.

Besides, the connection node OUTB between the PMOS transistors P13, P23, P33 and the respectively corresponding NMOS transistors N11, N12, N13 is connected to an output terminal OUT through an inverter Iv11.

Here, an input terminal S1 is connected to the gates of the PMOS transistor P11 at a first stage, the PMOS transistor P23 at a third stage and the PMOS transistor P32 at a second stage, an input terminal S2 is connected to the gates of the PMOS transistor P12 at the second stage, the PMOS transistor P21 at the first stage and the PMOS transistor P33 at the third stage, and an input terminal S3 is connected to the gates of the PMOS transistor P13 at the third stage, the PMOS transistor P22 at the second stage and the PMOS transistor P31 at the first stage.

When any of the input terminals S1–S3 becomes a high level, the corresponding one of the NMOS transistors N11, N12, N13 turns ON, and the corresponding ones of the PMOS transistors P11–P33 turn OFF in each individual block unit, so that the output becomes the high level.

Further, only in a case where all the input terminals S1–S3 have become a low level, all the NMOS transistors N11, N12, N13 turn OFF, and all the PMOS transistors P11–P33 of the individual blocks turn ON, so that the output becomes the low level.

Here, the threshold voltages of the PMOS transistors P11–P33 differ depending upon the stages at which these PMOS transistors P11–P33 are connected as seen from the supply voltage terminal VD, so that the delay values of the PMOS transistors P11–P33 change. The changes of the delay values become the disturbance of clock cycles called "jitter" and deteriorate a clock quality.

With the multi-input OR circuit in FIG. 10, therefore, three of the PMOS transistors P11–P33 are allotted to each of the input terminals S1–S3, and all the input terminals S1–S3 are brought to a symmetric structure, whereby delay values in the respective input terminals S1–S3 are equalized so as to suppress the jitter.

FIG. 11 is a diagram showing the second example arrangement of a multi-input OR circuit in the prior art. Incidentally, in the example of FIG. 11, a 3-input OR circuit is shown for the sake of brevity.

Referring to FIG. 11, a PMOS transistor P41, and three NMOS transistors N41, N42, N43 connected in parallel, are connected in series between a supply voltage terminal VD and a ground terminal G.

The connection nodes OUTB between the PMOS transistor P41 and the respective NMOS transistors N41, N42, N43 are connected to an output terminal OUT through an inverter IV12.

Here, an input terminal S1 is connected to the gate of the NMOS transistor N41, an input terminal S2 is connected to the gate of the NMOS transistor N42, and an input terminal S3 is connected to the gate of the NMOS transistor N43.

The gate of the PMOS transistor P41 is grounded, and a wired OR circuit in which the PMOS transistor P41 functions as a normally-ON load is constructed.

When any of the input terminals S1–S3 becomes a high level, the corresponding one of the NMOS transistors N41, N42, N43 turns ON, so that the output becomes the high level.

Further, only in a case where all the input terminals S1–S3 have become a low level, all the NMOS transistors N41, N42, N43 turn OFF, so that the output becomes the low level.

With the multi-input OR circuit in FIG. 10, however, when N input terminals exist, (N+1) transistors need to be connected in series between the supply voltage terminal VD and the ground terminal G. Therefore, as the number of input terminals increases, the number of transistors connected in series increases accordingly. This results in a problem in that the transistors fail to be rendered conductive. In accordance with a low-voltage IC process, the number of inputs of the multi-input OR circuit has been limited to 4 or so.

Meanwhile, there is also a method wherein the logical sum is taken in such a way that the multi-input OR circuit is divided into OR circuits each having a small number of inputs of 2–3 inputs, and that the OR circuits of the small number of inputs are connected in multiple stages. With this method, however, it is impossible to bring all the input terminals to a symmetric structure.

For this reason, this method has had the problem that the jitter exerts greater influence to deteriorate the clock quality.

On the other hand, with the multi-input OR circuit in FIG. 11, when any of the NMOS transistors N41, N42, N43 turns ON, a through current flows between the supply voltage terminal VD and the ground terminal G. This results in a problem in that power dissipation increases. The increase becomes more pronounced when an operating frequency heightens.

For this reason, the multi-input OR circuit in FIG. 11 is inappropriate for use in a frequency multiplier circuit in which a high-frequency operation is performed.

Therefore, one object of the present invention is to provide a pulse processing circuit which permits a low-voltage operation even in the case of an increased number of inputs, and which can take the logical sum of non-overlapping pulses with the increase of power dissipation suppressed.

Another object of the present invention is to provide a frequency multiplier circuit which permits a low-voltage operation and which can heighten a clock frequency with the increases of power dissipation and jitter suppressed.

SUMMARY OF THE INVENTION

In order to solve the above problems, a pulse processing circuit is characterized in that an output is changed to a high level or a low level in synchronism with a leading edge of any of a plurality of inputs, and that the output is changed to the low level or the high level in synchronism with a trailing edge of any of the plurality of inputs.

Thus, even in a case where the input level of any of the plurality of levels has changed, the level of the output can be changed in correspondence with the level change, and even in a case where the number of inputs has increased, the logical sum of non-overlapping pulses is taken, with the symmetric structure of the inputs maintained.

Therefore, the delay values of the outputs can be brought to agreement for any input, and a frequency multiplier circuit is permitted to operate at a high frequency, with the increase of jitter suppressed.

Another pulse processing circuit is characterized by comprising a plurality of gate circuits an output of each of which is changed to the high level or the low level in synchronism with the leading edge of the input, and the output of each of which is changed to the low level or the high level in synchronism with the trailing edge of the input, the outputs of the plurality of gate circuits being connected in common.

Thus, the number of input terminals can be increased merely by connecting the gate circuits in parallel, and the logical sum of non-overlapping pulses of multiple inputs can be taken while the increase of the number of elements to be connected in series between a supply voltage terminal and a ground terminal is suppressed.

Therefore, a low-voltage IC process can be applied without setting a limit to the number of inputs.

According to another pulse processing circuit, the gate circuit is characterized by comprising a charge storage portion which is connected to an output terminal; a switching element which feeds charges to the charge storage portion in synchronism with the leading edge or trailing edge of the input; and cutoff means for cutting off the switching element after a predetermined delay time has lapsed since the leading edge or trailing edge of the input.

Thus, after the output level is changed in correspondence with the level change of the input, the output terminal can be brought into a floating state, and even in a case where a plurality of output terminals are connected in common, all output levels can be caused to follow up any output level.

Therefore, even in the case where the input level of any of the plurality of levels has changed, the output level can be changed in correspondence with the level change, and the logical sum of multiple inputs is taken, merely by connecting the gate circuits in parallel in correspondence with the number of the input terminals.

Still further, according to another pulse processing circuit, the gate circuit is characterized by comprising first and second P-channel field-effect transistors which are connected in series between a supply voltage terminal and the output terminal; and first and second N-channel field-effect transistors which are connected in series between the output terminal and a ground terminal; respective gates of the first P-channel field-effect transistor and the first N-channel field-effect transistor being connected to an input terminal; respective gates of the second P-channel field-effect transistor and the second N-channel field-effect transistor being connected to the input terminal through an inverter.

Thus, merely by connecting the four transistors in series between the supply voltage terminal and the ground terminal, it is possible to change the output level in correspondence with the level change of the input, and to subsequently bring the output terminal into the floating state.

As a result, even in the case where the output terminals of the plurality of gate circuits are connected in common, the outputs of all the gate circuits can be caused to follow up the output fluctuation of any gate circuit, and even in the case where the input level of any of the plurality of levels has changed, the output level can be changed in correspondence with the level change.

Therefore, even in the case where the number of inputs has increased, the logical sum of multiple inputs is taken, merely by connecting the gate circuits in parallel in correspondence with the number of the inputs, and it becomes unnecessary to increase the number of transistors which are connected in series between the supply voltage terminal and the ground terminal, so that the low-voltage IC process can be applied with ease.

Moreover, by connecting the four transistors in series, a through current is prevented from flowing between the supply voltage terminal and the ground terminal, even in the case where the input level has changed, so that a lower power dissipation can be attained.

Yet further, another frequency multiplier circuit is characterized by comprising a PLL circuit which generates multiphase clocks, a pulse generator circuit which generates non-overlapping pulses on the basis of the multiphase clocks, and a pulse processing circuit which outputs a logical sum of the non-overlapping pulses; the pulse processing circuit having an output changed to a high level or a low level in synchronism with a leading edge of any of a plurality of inputs, and having the output changed to the low level or the high level in synchronism with a trailing edge of any of the plurality of inputs.

Thus, the symmetric structure of the inputs can be maintained irrespective of the number of inputs of the non-overlapping pulses, and the deterioration of a clock quality is prevented with the increase of jitter suppressed, and a lower power dissipation is attained.

Besides, another frequency multiplier circuit is characterized by comprising a DLL circuit which generates multiphase clocks, a pulse generator circuit which generates non-overlapping pulses on the basis of the multiphase clocks, and a pulse processing circuit which outputs a logical sum of the non-overlapping pulses; the pulse processing circuit having an output changed to a high level or a low level in synchronism with a leading edge of any of a plurality of inputs, and having the output changed to the low level or the high level in synchronism with a trailing edge of any of the plurality of inputs.

Thus, a clock whose frequency is N times higher can be generated without employing an oscillator, and the occurrence of low-frequency noise inherent in the oscillator is prevented. Simultaneously, even in case of obtaining the logical sum of the non-overlapping pulses, the symmetric structure of the inputs can be maintained irrespective of the number of inputs of the non-overlapping pulses, and the deterioration of a clock quality is prevented with the increase of jitter suppressed, and a lower power dissipation is attained.

Also, another frequency multiplier circuit is characterized in that the pulse processing circuit comprises a plurality of gate circuits an output of each is changed to the high level or the low level in synchronism with the leading edge of the input, and the output of each is changed to the low level or the high level in synchronism with the trailing edge of the input; and that the gate circuit comprises first and second P-channel field-effect transistors which are connected in series between a supply voltage terminal and an output terminal, and first and second N-channel field-effect transistors which are connected in series between the output terminal and a ground terminal; respective gates of the first P-channel field-effect transistor and the first N-channel field-effect transistor being connected to an input terminal; respective gates of the second P-channel field-effect transistor and the second N-channel field-effect transistor being connected to the input terminal through an inverter; the output terminal being connected in common with the other gate circuits.

Thus, even in the case where the number of inputs of the non-overlapping pulses has increased, the logical sum of the non-overlapping pulses is taken, merely by connecting the gate circuits in parallel in correspondence with the number of the inputs, and it becomes unnecessary to increase the number of the transistors which are connected in series between the supply voltage terminal and the ground terminal, so that the low-voltage IC process can be applied with ease.

Moreover, by connecting the four transistors in series, a through current is prevented from flowing between the supply voltage terminal and the ground terminal, even in the case where the input level of the non-overlapping pulse has changed, so that a lower power dissipation can be attained.

Further, all the gate circuits which are connected to the input terminals of the non-overlapping pulses can have the same arrangements, and all the input terminals of the non-overlapping pulses are brought to a symmetric structure.

Therefore, even in the case where the number of inputs of the non-overlapping pulses has increased, jitter is suppressed and the clock is generated with frequency N times higher, without involving the deterioration of a clock quality.

DETAILED DESCRIPTION OF THE PREFERRED EMBODIMENTS

A pulse processing circuit according to an embodiment of the present invention will be described with reference to the drawings.

Figure 1:
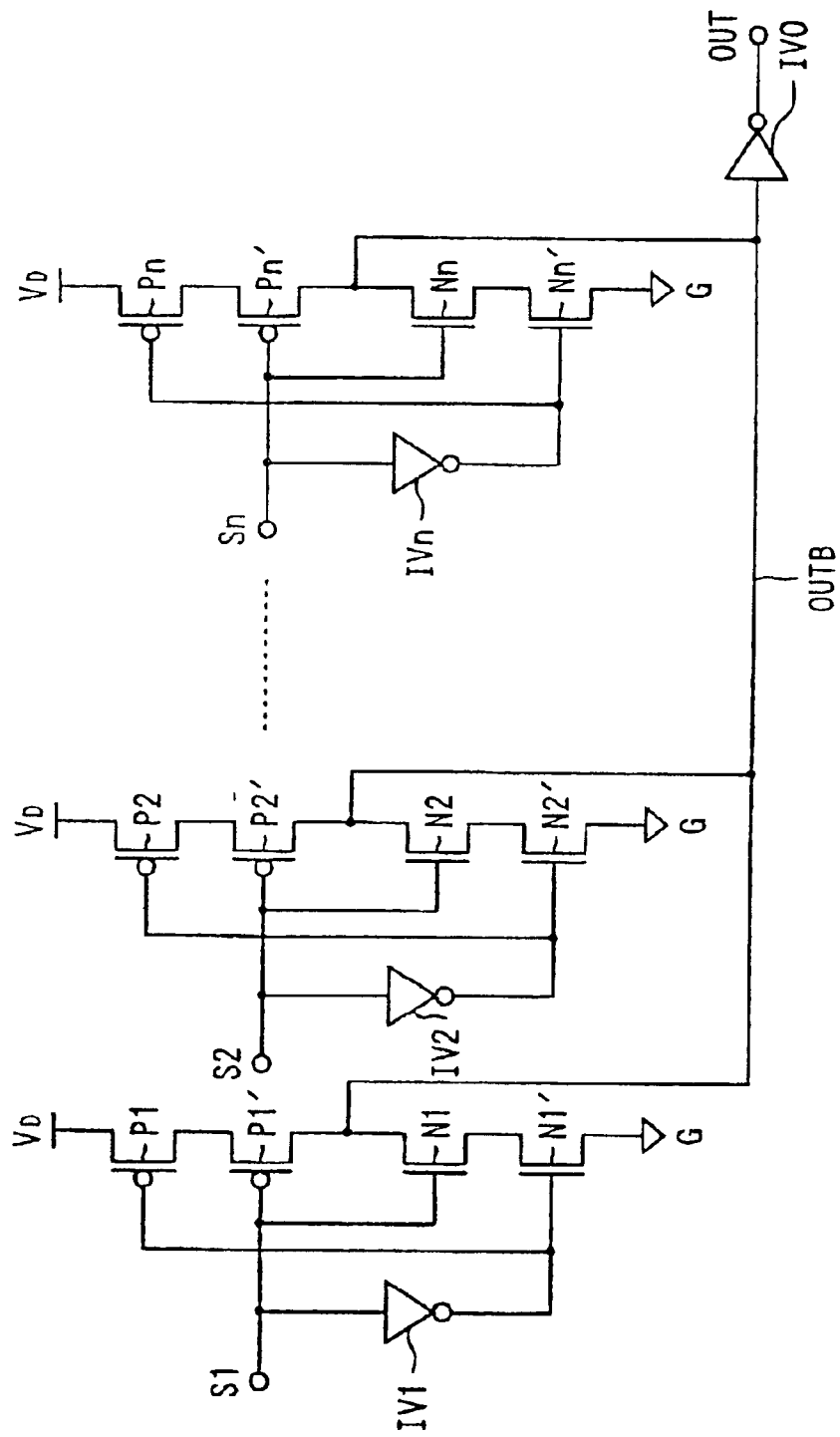
FIG. 1 is a diagram showing the arrangement of a pulse processing circuit according to one embodiment of the present invention.

FIG. 1 is a diagram showing the arrangement of the pulse processing circuit according to one embodiment of the present invention.

Referring to FIG. 1, the pulse processing circuit is constructed of N blocks, and each of the blocks is provided with two PMOS transistors and two NMOS transistors which are connected in series.

More specifically, PMOS transistors P1, P2, . . . , Pn and PMOS transistors P1', P2', . . . , Pn' are respectively connected in series between a supply voltage terminal VD and output terminals OUTB, while NMOS transistors N1, N2, . . . , Nn and NMOS transistors N1', N2', . . . , Nn' are respectively connected in series between the output terminals OUTB and a ground terminal G.

Besides, the output terminals OUTB of the respective blocks are connected to an output terminal OUT through an inverter IV0.

Further, input terminals S1–Sn are respectively connected to the gates of the PMOS transistors P1', P2', . . . , Pn' and NMOS transistors N1, N2, . . . , Nn, and they are respectively connected to the gates of the PMOS transistors P1, P2, . . . , Pn and NMOS transistors N1', N2', . . . , Nn' through corresponding inverters IV1–IVn.

Figure 2:
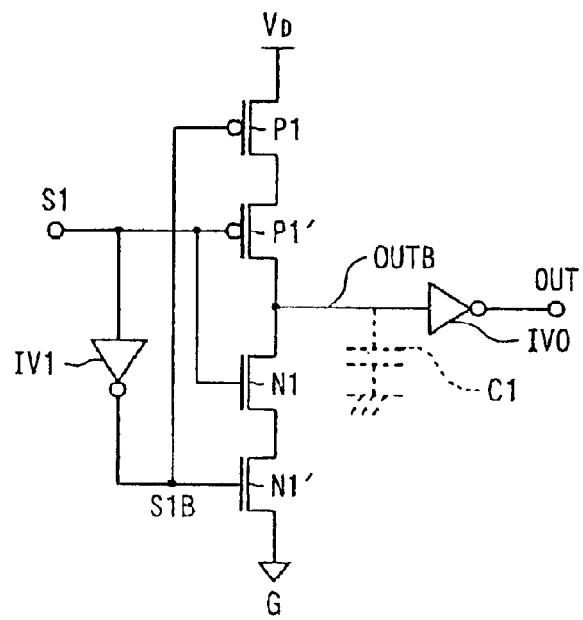
FIG. 2 is a diagram showing the arrangement of one block of the pulse processing circuit in FIG. 1.

FIG. 2 is a diagram showing the arrangement of one block of the pulse processing circuit in FIG. 1.

Referring to FIG. 2, PMOS transistors P1 and P1' are connected in series between a supply voltage terminal VD and an output terminal OUTB, and NMOS transistors N1 and N1' are connected in series between the output terminal OUTB and a ground terminal G.

The output terminal OUTB of the block is connected to an output terminal OUT through an inverter IV0. Incidentally, a parasitic capacitance C1 is involved in the output terminal OUTB.

Further, an input terminal S1 is connected to the gates of the PMOS transistor P1' and the NMOS transistor N1, and it is also connected to the gates of the PMOS transistor P1 and the NMOS transistor N1' through an inverter IV1.

Here, the inverter IV1 serves to invert an input signal, and to ensure the required minimum delay time of the input signal. In order to ensure the required delay time, the inverter IV1 is designed with its drivability intentionally lowered.

Incidentally, the example in FIG. 2 has been described with the inverter IV1 of only one stage interposed between the input terminal S1 and the gates of the PMOS transistor P1 and the NMOS transistor N1'. In order to adjust the delay value of the input signal, however, an odd number of inverters IV1 may be connected in multiple stages between the input terminal S1 and the gates of the PMOS transistor P1 and the NMOS transistor N1'.

Figure 3:
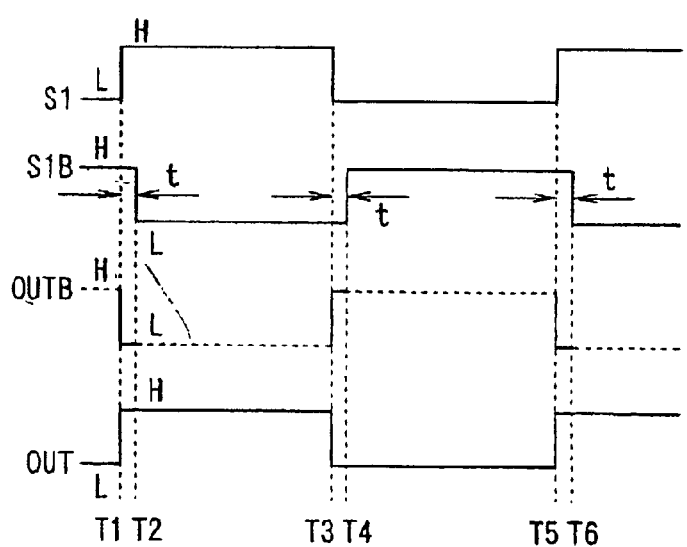
FIG. 3 is a timing chart showing the operation of the pulse processing circuit corresponding to one block in FIG. 2.

FIG. 3 is a timing chart showing the operation of the pulse processing circuit corresponding to one block in FIG. 2.

When the input terminal S1 changes from a low level to a high level at a time T1 in FIG. 3, the PMOS transistor P1' turns OFF, and the NMOS transistor N1 turns ON.

Meanwhile, the level change of the input terminal S1 is propagated to a terminal S1B connected to the gates of the PMOS transistor P1 and the NMOS transistor N1', after a delay time t. At the time T1, therefore, the terminal S1B remains at the high level.

As a result, the PMOS transistor P1 remains OFF, and the NMOS transistor N1' remains ON.

Therefore, the path between the supply voltage terminal VD and the output terminal OUTB falls into a nonconductive state, and the path between the output terminal OUTB and the ground terminal G falls into a conductive state, so that the output terminal OUTB of the block changes from the high level to the low level.

Also, the level of the output terminal OUTB of the block is inverted by the inverter IV0, so that the output terminal OUT changes from the low level to the high level.

Subsequently, at a time T2 at which the delay time t based on the inverter IV1 has lapsed since the time T1, the level change of the input terminal S1 propagates to the terminal S1B, and this terminal S1B changes from the high level to the low level.

As a result, the PMOS transistor P1 turns ON, and the NMOS transistor N1' turns OFF, so that the path between the supply voltage terminal VD and the output terminal OUTB maintains the nonconductive state, and also the path between the output terminal OUTB and the ground terminal G falls into a nonconductive state.

Therefore, the output terminal OUTB falls into a floating state, and due to the charge retention of the parasitic capacitance C1, the output terminal OUTB maintains the low level, while the output terminal OUT maintains the high level.

Subsequently, at a time T3 at which the input terminal S1 changes from the high level to the low level, the PMOS transistor P1' turns ON, and the NMOS transistor N1 turns OFF.

Meanwhile, the level change of the input terminal S1 is propagated to the terminal S1B connected to the gates of the PMOS transistor P1 and the NMOS transistor N1', after the delay time t. At the time T3, therefore, the terminal S1B remains at the low level.

As a result, the PMOS transistor P1 remains ON, and the NMOS transistor N1' remains OFF.

Therefore, the path between the supply voltage terminal VD and the output terminal OUTB falls into a conductive state, and the path between the output terminal OUTB and the ground terminal G falls into the nonconductive state, so that the output terminal OUTB of the block changes from the low level to the high level.

Also, the level of the output terminal OUTB of the block is inverted by the inverter IV0, so that the output terminal OUT changes from the high level to the low level.

Subsequently, at a time T4 at which the delay time t based on the inverter IV1 has lapsed since the time T3, the level change of the input terminal S1 propagates to the terminal S1B, and this terminal S1B changes from the low level to the high level.

As a result, the PMOS transistor P1 turns OFF, and the NMOS transistor N1' turns ON, so that the path between the output terminal OUTB and the ground terminal G maintains the nonconductive state, and also the path between the supply voltage terminal VD and the output terminal OUTB falls into the nonconductive state.

Therefore, the output terminal OUTB falls into the floating state, and due to the charge retention of the parasitic capacitance C1, the output terminal OUTB maintains the high level, while the output terminal OUT maintains the low level.

Here, the output terminal OUTB is in the floating state during an interval from the time T2 to the time T3 and an interval from the time T4 to a time T5. Accordingly, when an external potential fluctuation is applied to the output terminal OUTB, the level of this output terminal OUTB changes in accordance with the external potential fluctuation.

Consequently, when the level of the output terminal OUTB of any of the blocks as shown in FIG. 1 changes, the output terminals OUTB of all the blocks follows up the level change, and the level of the output terminal OUT fluctuates in synchronism with the fluctuation of the level of any of the plurality of input terminals S1–Sn.

Here, when the level of any of the input terminals S1–Sn becomes the high level, the output terminal OUT also becomes the high level. In this manner, the logical sum of non-overlapping pulses is taken by employing the pulse processing circuit in FIG. 1.

Therefore, even in a case where the number of the input terminals S1–Sn has increased, the number of transistors to be connected in series between the supply voltage terminal VD and the ground terminal G need not be increased, and the low-voltage IC process can be applied with ease.

Moreover, by connecting the four transistors in series, a through current is prevented from flowing between the supply voltage terminal VD and the ground terminal G, even when the level of any of the input terminals S1–Sn has changed, so that a lower power dissipation can be attained.

Further, merely by connecting the N blocks corresponding to the input terminals S1–Sn in parallel, an N-input pulse processing circuit can be composed, so that the symmetric structure of the input terminals S1–Sn can be maintained.

Therefore, even in a case where the pulse processing circuit in FIG. 1 is applied to a frequency multiplier circuit, the increase of jitter is suppressed, and the number of input terminals for non-overlapping pulses can be increased without enlarging a supply voltage, whereby a clock at a frequency N times higher can be obtained with ease.

Next, there will be described the frequency multiplier circuit to which the pulse processing circuit in FIG. 1 is applied.

Figure 4:
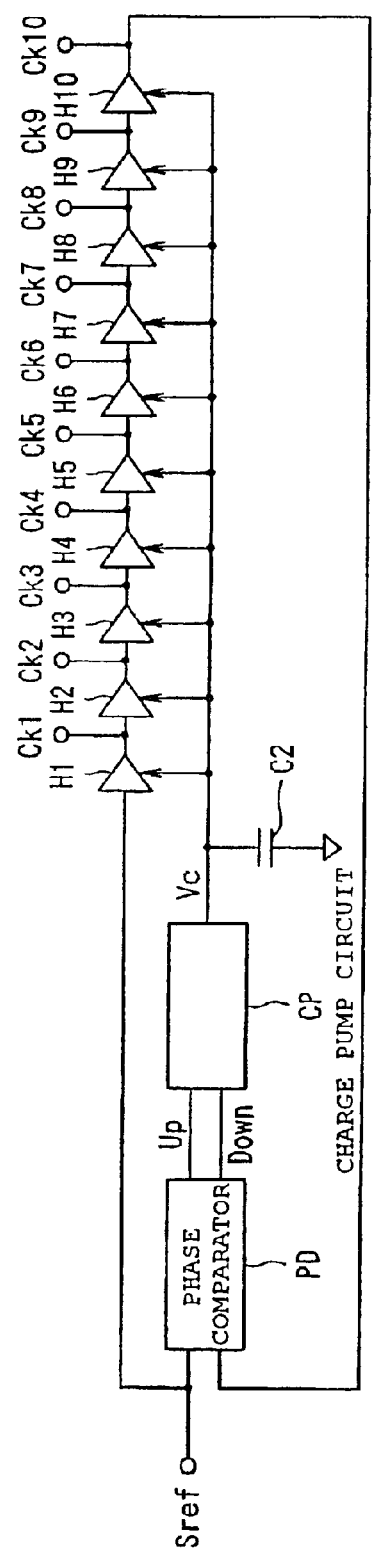
FIG. 4 is a block diagram showing an example of an arrangement of a DLL circuit which is applied to a frequency multiplier circuit according to the first embodiment of the present invention.

FIG. 4 is a block diagram showing an example of an arrangement of a DLL circuit which is applied to the frequency multiplier circuit according to the first embodiment of the present invention.

Referring to FIG. 4, the DLL circuit is provided with a phase comparator PD, a charge pump circuit CP, a capacitor C2, and delay circuits H1–H10.

Here, the delay circuits H1–H10 are connected in cascade, and multiphase clocks Ck1–Ck10 are output from the respective delay circuits H1–H10. A reference signal Sref is input to the initial stage of the delay circuits H1–H10, and the signal Ck10 of the final stage of the delay circuits H1–H10 is fed back to the phase comparator PD.

Also, the signal Ck10 fed back to the phase comparator PD is compared with the reference signal Sref in the phase comparator PD, and an "up" signal Up or a "down" signal Down is output to the charge pump circuit CP in correspondence with the shift between the phases of the signal Ck10 and the reference signal Sref.

Upon receiving the signal Up, the charge pump circuit CP stores charges in the capacitor C2, and upon receiving the signal Down, it discharges the charges stored in the capacitor C2. Further, a voltage which is prescribed by the charges stored in the capacitor C2 is output to the individual delay circuits H1–H10 as a control voltage Vc.

The delay circuits H1–H10 have their delay values changed by the control voltage Vc, and the multiphase clocks Ck1–Ck10 which are output from the respective delay circuits H1–H10 have their delay values controlled so that the phases of the signal Ck10 and the reference signal Sref may agree.

Figure 5:
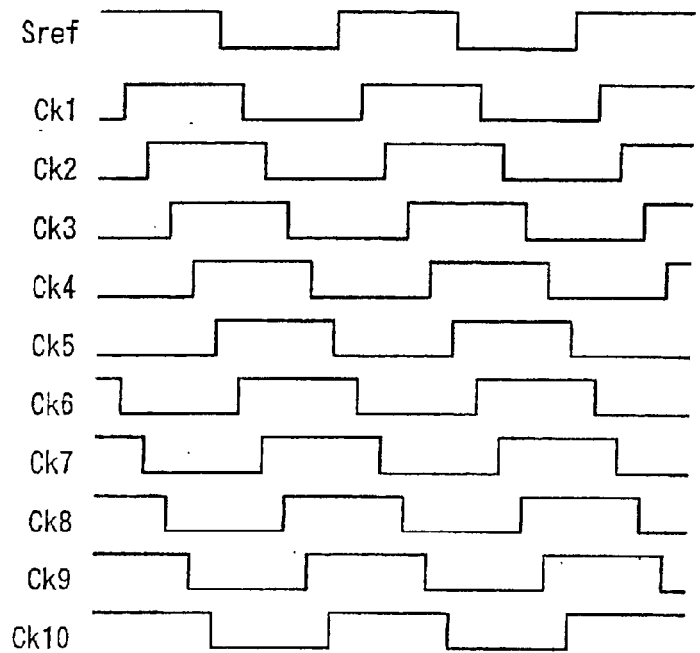
FIG. 5 is a diagram showing an example of multiphase clocks which are outputted from the frequency multiplier circuit in FIG. 4.

It is consequently possible to generate the multiphase clocks Ck1–Ck10 of 10 phases which shift every $1/10$ cycle as shown in FIG. 5.

Figure 6:
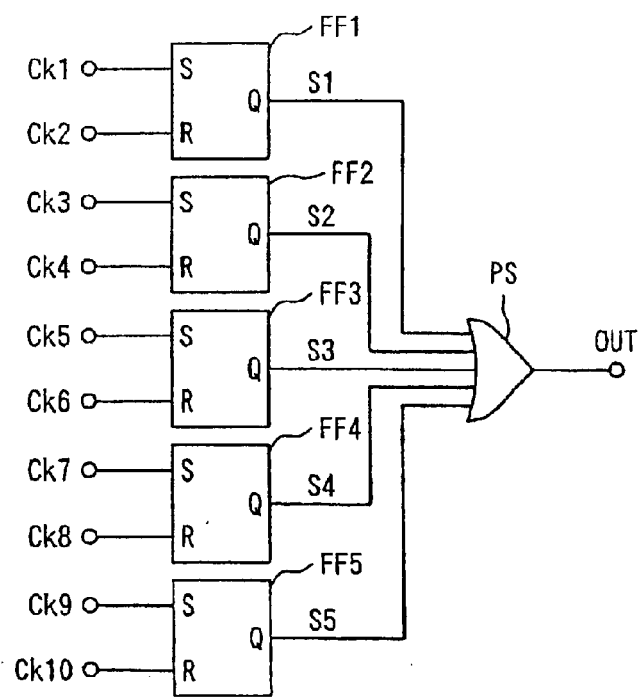
FIG. 6 is a diagram showing an example of an arrangement of a clock logic synthesis circuit according to one embodiment of the present invention.

The multiphase clocks Ck1–Ck10 generated by the DLL circuit in FIG. 4 are output to a clock logic synthesis circuit shown in FIG. 6.

FIG. 6 is a diagram showing an example of an arrangement of the clock logic synthesis circuit according to one embodiment of the present invention.

Referring to FIG. 6, the clock logic synthesis circuit is provided with RS flip-flops FF1–FF5 and a pulse processing circuit PS, and the pulse processing circuit PS can employ the arrangement in FIG. 1.

Here, the clocks Ck1, Ck2 are input to the RS flip-flop FF1, the clocks Ck3, Ck4 to the RS flip-flop FF2, the clocks Ck5, Ck6 to the RS flip-flop FF3, the clocks Ck7, Ck8 to the RS flip-flop FF4, and the clocks Ck9, Ck10 to the RS flip-flop FF5.

Also, the RS flip-flops FF1–FF5 detect the leading edges of the associated clocks Ck1–Ck10 and output non-overlapping pulses corresponding to the shifts of the phases of the associated clocks Ck1–Ck10.

The non-overlapping pulses are respectively delivered to the input terminals S1–S5 of the pulse processing circuit PS, and the logical sum of the non-overlapping pulses is taken by the pulse processing circuit PS.

Figure 7:
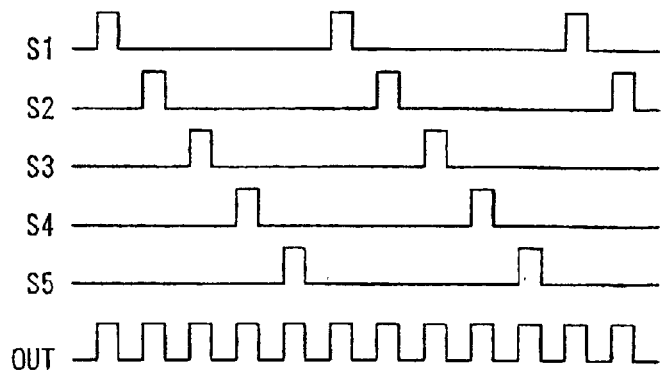
FIG. 7 is a timing chart showing the operation of the clock logic synthesis circuit in FIG. 6.

As a result, a clock signal whose frequency is 5 times as high as that of the reference signal Sref is output from the output terminal OUT of the pulse processing circuit PS as shown in FIG. 7.

Here, the arrangement in FIG. 1 is employed for taking the logical sum of the non-overlapping pulses in FIG. 7, whereby the symmetric structure of the input terminals S1–S5 can be maintained irrespective of the number of inputs of the non-overlapping pulses. Thus, the increase of jitter is suppressed and the deterioration of a clock quality is prevented, and also a lower power dissipation and a lower voltage are attained.

Also, the DLL circuit is employed for generating the multiphase clocks Ck1–Ck10, whereby the clock whose frequency is N times higher can be generated without employing an oscillator, and the occurrence of low-frequency noise inherent in the oscillator is prevented.

Figure 8:
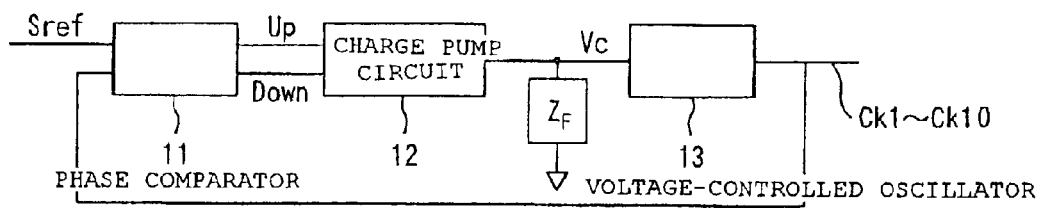
FIG. 8 is a block diagram showing an example of an arrangement of a PLL circuit which is applied to a frequency multiplier circuit according to the second embodiment of the present invention.
Figure 9:
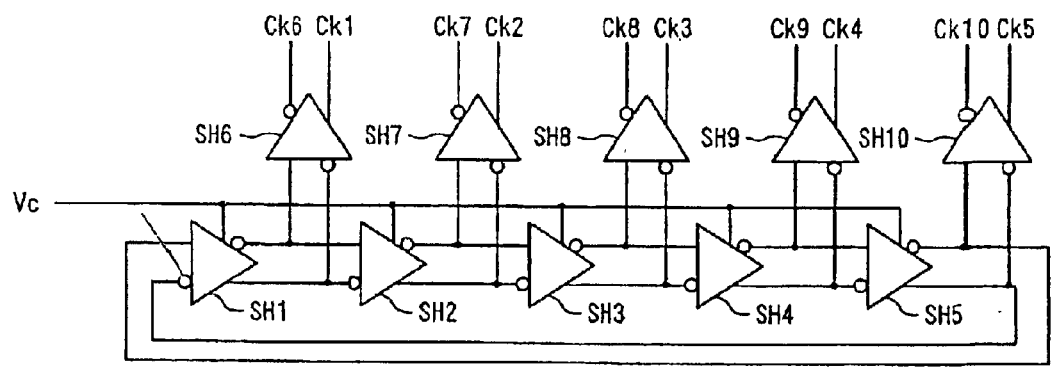
FIG. 9 is a diagram showing an example of an arrangement of a voltage-controlled oscillator in FIG. 8.
Figure 10:
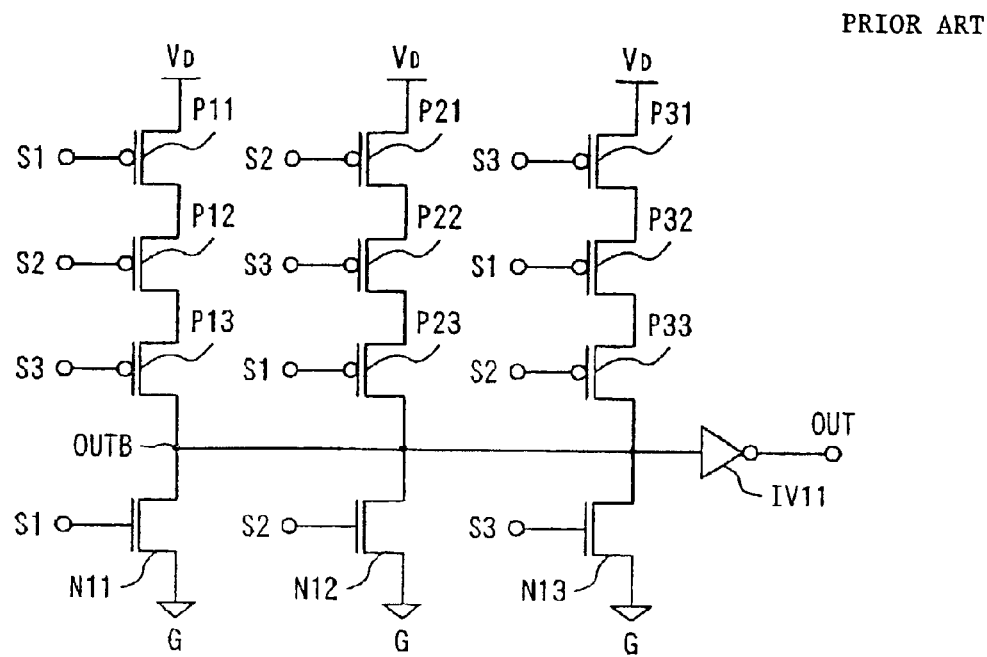
FIG. 10 is a diagram showing the first example of an arrangement of a multi-input OR circuit in the prior art.
Figure 11:
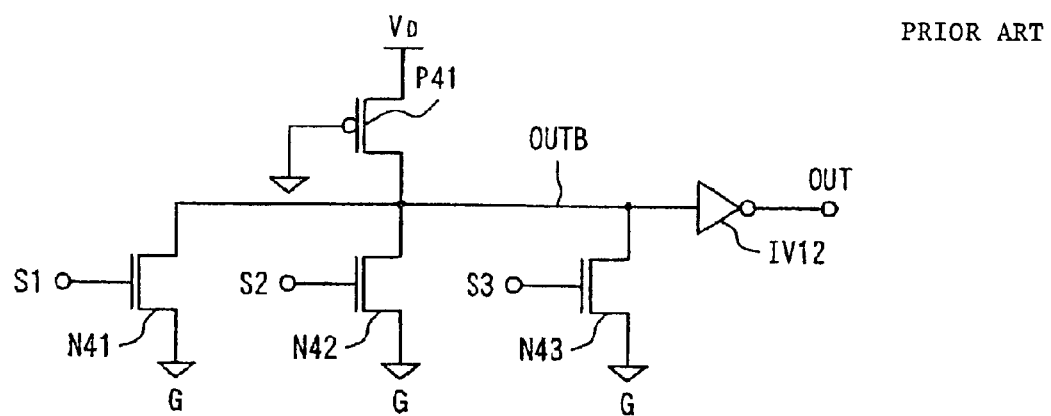
FIG. 11 is a diagram showing the second example of an arrangement of a multi-input OR circuit in the prior art.

FIG. 8 is a block diagram showing an example of arrangement of a PLL circuit which is applied to a frequency multiplier circuit according to the second embodiment of the present invention, while FIG. 9 is a diagram showing an example of an arrangement of a voltage-controlled oscillator in FIG. 8.

Referring to FIGS. 8 and 9, the PLL circuit is provided with a phase comparator 11, a charge pump circuit 12 and a voltage-controlled oscillator 13, and this voltage-controlled oscillator 13 is provided with differential delay circuits SH1–SH10.

Here, the differential delay circuits SH1–SH5 are connected in cascade, and the final stage of these differential delay circuits SH1–SH5 is connected to the initial stage thereof, whereby a ring oscillator is constructed.

Besides, a control voltage Vc output from the charge pump circuit 12 is input to the individual differential delay circuits SH1–SH5 so as to control delay values on the basis of the control voltage Vc.

Further, the inverting output terminal of the differential delay circuit SH1 is connected to the non-inverting input terminal of the differential delay circuit SH6, the non-inverting output terminal of the differential delay circuit SH1 to the inverting input terminal of the differential delay circuit SH6, the inverting output terminal of the differential delay circuit SH2 to the non-inverting input terminal of the differential delay circuit SH7, the non-inverting output terminal of the differential delay circuit SH2 to the inverting input terminal of the differential delay circuit SH7, the inverting output terminal of the differential delay circuit SH3 to the non-inverting input terminal of the differential delay circuit SH8, the non-inverting output terminal of the differential delay circuit SH3 to the inverting input terminal of the differential delay circuit SH8, the inverting output terminal of the differential delay circuit SH4 to the non-inverting input terminal of the differential delay circuit SH9, the non-inverting output terminal of the differential delay circuit SH4 to the inverting input terminal of the differential delay circuit SH9, the inverting output terminal of the differential delay circuit SH5 to the non-inverting input terminal of the differential delay circuit SH10, and the non-inverting output terminal of the differential delay circuit SH5 to the inverting input terminal of the differential delay circuit SH10.

Also, multiphase clocks Ck1–Ck5 are respectively output from the non-inverting output terminals of the differential delay circuits SH6–SH10, while multiphase clocks Ck6–Ck10 are respectively output from the inverting output terminals of the differential delay circuits SH6–SH10.

Here, any clock of the multiphase clocks Ck1–Ck10 output from the voltage-controlled oscillator 13 is input to the phase comparator 11.

Further, a reference signal Sref is input to the phase comparator 11, and compared with the signal input from the voltage-controlled oscillator 13. Thus, an "up" signal Up or a "down" signal Down is output to the charge pump circuit 12 in correspondence with the shift between the phases of the reference signal Sref and the signal input from the voltage-controlled oscillator 13.

The charge pump circuit 12 raises the control voltage Vc in response to the signal Up and lowers the control voltage Vc in response to the signal Down, and it outputs the resulting control voltage Vc to the voltage-controlled oscillator 13.

In the voltage-controlled oscillator 13, the delay values of the differential delay circuits SH1–SH5 are changed by the control voltage Vc, and the multiphase clocks Ck1–Ck10 which are output from the differential delay circuits SH6–SH10 have their delay values controlled so that the phases of the reference signal Sref and the signal output from the voltage-controlled oscillator 13 may agree.

It is consequently possible to generate the multiphase clocks Ck1–Ck10 of 10 phases which shift every $1/10$ cycle as shown in FIG. 5.

The multiphase clocks Ck1–Ck10 generated by the PLL circuit in FIG. 8 are output to the clock logic synthesis circuit shown in FIG. 6.

In this manner, even in the case where the PLL circuit is employed for generating the multiphase clocks Ck1–Ck10, the clock signal whose frequency is N times higher can be obtained with a lower power dissipation and a lower noise attained.

As described above, according to the present invention, even in a case where the number of inputs has increased, the logical sum of non-overlapping pulses of multiple inputs is taken, by connecting gate circuits in parallel in correspondence with the number of the inputs, and it becomes unnecessary to increase the number of transistors which are connected in series between a supply voltage terminal and a ground terminal, so that a low-voltage IC process can be applied with ease.

Also, a through current is prevented from flowing between the supply voltage terminal and the ground terminal, and a lower power dissipation is attained.

Further, all the gate circuits which are connected to respective input terminals can have the same arrangements, and the logical sum of the non-overlapping pulses of the multiple inputs is taken with the symmetric structure of all the input terminals maintained, so that even in case of application to a frequency multiplier circuit, the deterioration of a clock quality can be prevented by suppressing jitter.

The entire disclosure of Japanese Patent Application No. 2001-321120 filed Oct. 18, 2001 is incorporated by reference herein.

What is claimed is:

1. A pulse processing circuit comprising:
   a plurality of gate circuits, each having an output, the outputs being connected in common, and each circuit further comprising:
     a charge storage portion connected to an output terminal;
     a switching element feeding charges to the charge storage portion in synchronism with the leading edge or trailing edge of the input; and
     cutoff means cutting off the switching element after a predetermined delay time lapses after the leading edge or trailing edge of the input,
   wherein each output changes to one of a high level and a low level in synchronism with a leading edge of any of a plurality of inputs, and changes to the low level or the high level in synchronism with a trailing edge of any of the inputs.

2. The pulse processing circuit as defined in claim 1, wherein each gate circuit further comprises:
   first and second P-channel field-effect transistors connected in series between a supply voltage terminal and the output terminal; and
   first and second N-channel field-effect transistors connected in series between the output terminal and a ground terminal;
   respective gates of the first P-channel field-effect transistor and the first N-channel field-effect transistor being connected to an input terminal;
   respective gates of the second P-channel field-effect transistor and the second N-channel field-effect transistor being connected to the input terminal through an inverter.

3. A frequency multiplier circuit comprising:
   a PLL circuit which generates multiphase clocks;
   a pulse generator circuit which generates non-overlapping pulses on the basis of the multiphase clocks; and
   a pulse processing circuit that comprises a plurality of gate circuits, each having an output changed to a high level or a low level in synchronism with a leading edge of an input, and changed to the low level or the high level in synchronism with a trailing edge of the input, wherein the pulse processing circuit outputs a logical sum of the non-overlapping pulses,
   the gate circuits comprising:
   first and second P-channel field-effect transistors connected in series between a supply voltage terminal and an output terminal; and
   first and second N-channel field-effect transistors connected in series between the output terminal and a ground terminal;
   respective gates of the first P-channel field-effect transistor and the first N-channel field-effect transistor being connected to an input terminal;
   respective gates of the second P-channel field-effect transistor and the second N-channel field-effect transistor being connected to the input terminal through an inverter;
   the output terminal being connected in common with the other gate circuits.

4. A frequency multiplier circuit comprising:
   a DLL circuit which generates multiphase clocks;
   a pulse generator circuit which generates non-overlapping pulses on the basis of the multiphase clocks; and
   a pulse processing circuit that comprises a plurality of gate circuits, each having an output changed to a high level or a low level in synchronism with a leading edge of an input, and changed to the low level or the high level in synchronism with a trailing edge of the input, wherein the pulse processing circuit outputs a logical sum of the non-overlapping pulses,
   the gate circuits comprising:
   first and second P-channel field-effect transistors connected in series between a supply voltage terminal and an output terminal; and
   first and second N-channel field-effect transistors connected in series between the output terminal and a ground terminal;
   respective gates of the first P-channel field-effect transistor and the first N-channel field-effect transistor being connected to an input terminal;
   respective gates of the second P-channel field-effect transistor and the second N-channel field-effect transistor being connected to the input terminal through an inverter;
   the output terminal being connected in common with the other gate circuits.

5. A pulse processing circuit comprising:
   a plurality of gate circuits, each gate circuit including:
   first and second P-channel field-effect transistors connected in series between a supply voltage terminal and an output terminal; and
   first and second N-channel field-effect transistors connected in series between the output terminal and a ground terminal;
   the outputs of the plurality of gate circuits being connected in common;

respective gates of the first P-channel field-effect transistor and the first N-channel field-effect transistor being connected to an input terminal;

respective gates of the second P-channel field-effect transistor and the second N-channel field-effect transistor being connected to the input terminal through an inverter;

wherein each output changes to one of a high level and a low level in synchronism with a leading edge of any of a plurality of inputs, and changes to the low level or the high level in synchronism with a trailing edge of any of the plurality of inputs.

6. The pulse processing circuit as defined in claim 5, wherein each gate circuit further comprises:

a charge storage portion connected to an output terminal;

a switching element feeding charges to the charge storage portion in synchronism with the leading edge or trailing edge of the input; and cutoff means cutting off the switching element after a predetermined delay time lapses after the leading edge or trailing edge of the input.

* * * * *